United States Patent [19]
Okuda

[11] Patent Number: 5,426,609
[45] Date of Patent: Jun. 20, 1995

[54] READ ONLY MEMORY CAPABLE OF WRITING DATA AND METHOD OF WRITING/READING DATA THEREFOR

[75] Inventor: Yasuhiro Okuda, Itami, Japan

[73] Assignee: Mitsubishi Denki Kabushiki Kaisha, Tokyo, Japan

[21] Appl. No.: 202,241

[22] Filed: Feb. 25, 1994

[30] Foreign Application Priority Data

Mar. 16, 1993 [JP] Japan .................................. 5-055646

[51] Int. Cl.$^6$ .............................................. G11C 7/00
[52] U.S. Cl. ................... 365/201; 365/189.01; 365/227
[58] Field of Search ................. 365/189.01, 201, 226, 365/227, 210

[56] References Cited

U.S. PATENT DOCUMENTS

| | | | |
|---|---|---|---|
| 5,258,959 | 11/1993 | Dallabora et al. | 365/210 |
| 5,287,326 | 2/1994 | Hirata | 365/189.01 X |
| 5,295,108 | 3/1994 | Higa | 365/218 |

Primary Examiner—Joseph A. Popek
Assistant Examiner—Son Dinh
Attorney, Agent, or Firm—Lowe, Price, Leblanc & Becker

[57] ABSTRACT

A read only memory capable of writing data, which is provided with a number of "0" judging circuit (8) judging whether or not the number of bits of "0" of data to be written in the memory cell array (1) is more than a half or more of a predetermined bit length, a monitor bit cell group (9) storing the above judge result by corresponding it to the respective data, and with a data inverting select circuit (12) outputting the values of the respective bits of the data after inverting them to a data writing/reading circuit (2) when the number of bits of "0" in the data to be written is judged to be a half or more of the predetermined bit length, and outputting the values of the respective bits of data read from the memory cell array (1) after inverting them when the monitor bit cell group (9) stored that the number of bits of "0" in the data to be read is a half or more of the predetermined bit length, and is capable of reducing an aluminum width of a power source of a PROM, and, when the data length to be written by one writing operation is enlarged, is no need to enlarge the aluminum width of the power source line and is capable of reducing electric current to be consumed for there.

10 Claims, 3 Drawing Sheets

READ ONLY MEMORY CAPABLE OF WRITING DATA AND METHOD OF WRITING/READING DATA THEREFOR

BACKGROUND OF THE INVENTION

1. Field of the Invention

The present invention relates to a read only memory capable of writing data called a PROM (Programmable Read only Memory), particularly to an EEPROM (Electrically Erasable PROM) which is a read only storage element capable of writing data by an electrical operation and to the method of writing/reading data.

2. Description of Related Art

FIG. 1 is a block diagram showing a configuration of a conventional PROM as a read only memory capable of writing data, built in a general microcomputer.

In FIG. 1, reference numeral 1 designates a memory cell array as a memory unit for holding data, in which plural memory cells 1a are arranged in a state of matrix of row×column direction.

The memory cell array 1 is connected to a data bus DB through a data writing/reading (W/R) circuit 2 which is to be described later. In respective memory cells 1a, values of respective bits of respective data inputted from the data bus DB are written by the data writing/reading circuit 2, while the respective values stored in the respective memory cells 1a are read out to the data bus DB as the values of respective bits of the data.

Respective memory cells 1a in the memory cell array 1 are arranged in a state of matrix, as aforementioned. The memory cells 1a in the respective rows (columns) direction are connected to the respective common word lines 7, and the respective memory cells 1a in the respective columns (rows) direction are connected to the respective common bit lines 6. Accordingly, each memory cell 1a is connected to any one word line 7 and any one bit line 6.

Each word line 7 is connected to a word select circuit 20 and each bit line 6 is to the data writing/reading circuit 2.

To the data writing/reading circuit 2, a data read signal (hereinafter to be called a DR signal) line 3, a data writing pulse signal (hereinafter to be called a PGM signal) line 4 and a power source line 5 are connected.

The power source line 5 supplies a data writing voltage $V_{pp}$ to the data writing/reading circuit 2. When the DR signal given to the data writing/reading circuit 2 by the DR signal line 3 becomes active, data is read from the respective memory cells 1a of one row (column) connected to one word line 7 of the memory cell array 1 to the data writing/reading circuit 2. When the PGM signal given to the memory cell array 1 by the PGM signal line 4 becomes low ("L") level, the power source line 5 is selectively connected to the bit line 6 into which data "0" is to be written, and data writing voltage $V_{pp}$ is outputted.

The operation at the time of data writing of the conventional PROM so configured as aforementioned is as follows.

At first, data to be stored in the memory cell array 1 is given to the data writing/reading circuit 2 from the data bus DB, and at the same time, an address signal indicating an address of the memory cell array 1 in which the data is to be stored is given to a decoder (not shown) from the outside.

Responsive to the decode result of the address signal given from the outside, the word select circuit 20 selects one word line 7, thereby respective memory cells 1a of one row (column) connected to the selected word line 7 are accessed.

Next, when the PGM signal given by the PGM signal line 4 becomes "L" level, the data writing/reading circuit 2 fixes the electric potential of the bit line 6 connected to the memory cell 1a, into which data "0" is to be written, at the data writing voltage $V_{pp}$ given from the power source line 5. While the PGM signal keeps "L" level, electric current is made to flow between source and drain of each memory cell 1a, thereby data writing is performed.

Each operation of the data writing, in other words, electric current $I_{pp}$ necessary for writing data in each row (column) of the memory cell array 1 is determined by the number of bits of "0" in the data to be written in each row (column) of the memory cell array 1. Therefore, when all of the bits of the data to be written in one row (column) are "0" the electric current $I_{pp}$ becomes maximum Since, usually the electric current $I_{pp}$ necessary for writing one data "0" is 1 mA or so, when, for example, data is written in the memory cell array 1 in 16 bits unit, the maximum value of the electric current $I_{pp}$ is about 16 mA.

On the other hand, the operation at the time of data reading is as follows.

At first, an address signal, indicating an address of the memory cell 1a in which data to be read from the memory cell array 1, is given to the decoder (not shown) from the outside.

Responsive to the decode result of the address signal given from the outside, the word select circuit 20 selects one word line 7, thereby the respective memory cells 1a of one row (column) of the memory cell array 1 connected to the selected word line 7 are accessed.

Next, when the DR signal given form the DR signal line 3 becomes active, the data writing/reading circuit 2 reads signals (data) stored in the respective memory cells 1a of one row (column) connected to the word line 7 selected by the word select circuit 20 and outputs it to the data bus DB.

In the conventional PROM, that is, in the read only memory capable of writing data, since data is written in such a way as aforementioned, when all of the bits of the data to be written are "0" in an operation of writing data, the electric current $I_{pp}$ for writing data "0" becomes maximum. On the other hand, aluminum width of the power source line, which supplies the data writing voltage $V_{pp}$, is required to have a width which allows the maximum value of the aforementioned data writing current $I_{pp}$ and the current to be consumed increases. And when length of the data to be written in the PROM is enlarged, from 16 bits to 32 bits, for example, it is necessary to enlarge the aluminum width of the power source line correspondingly, and the current to be consumed also increases proportionally.

SUMMARY OF THE INVENTION

The present invention has been devised in such circumstances, and the objects of the invention are to provide a read only memory capable of writing data and of reducing consumed current, which can reduce the aluminum width of the power source line of the conventional read only memory capable of writing data and does not have to enlarge the aluminum width of the power source line when data length of the data to be written by one writing operation is enlarged, and to provide the method of writing/reading data.

The read only memory capable of writing data related to the invention is provided with judging means which judges whether or not the number of bits of the first value in data to be written in the memory unit is a half or more of a predetermined bit length, judge result storing means which stores the judge result by the judging means by corresponding it to each data, and with data inverting means which inverts values of the respective bits of data and outputs them to data writing/reading means when the number of bits of the first value of the data to be written into the memory unit is judged to be a half or more of the predetermined bit length by the judging means, and which inverts values of the respective bits of data read from the memory unit by the data writing/reading means and outputs them to the data bus, when the judge result storing means stores that the number of bits of the first value in the data to be read from the memory unit is a half or more of the the predetermined bit length.

In such a read only memory capable of writing data of the invention, the judging means judges that whether the number of bits of the first value in the data to be written in the memory unit is a half or more of a predetermined bit length or not, the judge result storing means stores the above judge result which is made to correspond to the respective data, and at the time of writing data the data writing/reading means writes data into the memory unit after the values of the respective bits of the data inputted from the data bus are inverted by data inverting means, when the number of bits of the first value in the data to be written is a half or more of the predetermined bit length, and at the time of reading data, the values of the respective bits of the data read from the memory unit by the data writing/reading means are inverted by the data inverting means and outputted to the data bus, when the fact that the number of bits of the first value in the data to be read is a half or more of the predetermined bit length is stored in the judge result storing means.

In the read only memory capable of writing data of the invention, the aforementioned judge result storing means is provided with a judge result memory unit comprising plural judge result memory cells in which the first values is written when electric current flows and the second value when electric current does not flow, and with judge result data writing/reading means which writes the second value when the judging means judges that the number of bits of the first value in data to be written in the memory unit is a half or more of a predetermined bit length, which writes the first value when the judging means judges that the number of bits of the first value in the data to be written in the memory unit is less than a half of a predetermined bit length, into the judge result memory cells corresponding to each data, and which reads a value stored in the judge result memory cell corresponding to the data to be read from the memory unit and outputs it to the data writing/reading means.

Further, in such the read only memory capable of writing data of the invention, at the aforementioned judge result storing means, the first value is written when electric current flows through the plural judge result memory cells of the judge result memory unit, and the second value is written when electric current does not flow, and at the time of writing data to the memory unit, the second data is written when the number of bits of the first value in data to be written to the memory unit is judged to be a half or more of a predetermined bit length, and the first value is written when the number of bits of the first value in data to be written into the memory unit is less than a half, into the judge result memory cells corresponding to the respective data by the judge result data writing/reading means, and at the time of reading data from the memory unit, a value stored in the judge result memory cell corresponding to the data to be read from the memory unit is read from the data writing/reading means.

Further, method of writing/reading data of read only memory capable of writing data of the invention, comprising steps for judging whether or not the number of bits of the first value in data to be written in the memory unit is a half or more of a predetermined bit length is judged, writing data after inverting the values of the respective bits thereof when the number of bits of the first value in the data to be written in the memory unit is judged to be a half or more of the predetermined bit length and writing data intact in other cases, into the designated memory cells of the memory unit, and reading data after inverting the values of the respective bits thereof read from the designated memory cells of the memory unit when the number of bits of the first value in the data is a half or more of the predetermined bit length, and is read intact in other cases.

Furthermore, according to such a method of writing/reading data of a read only memory capable of writing data of the invention, at the time of writing data, the number of bits of the first value in data to be written in the memory unit is judged whether it is a half or more of a predetermined bit length or not, and written into the designated memory cells respectively, after the values of the respective bits of the data inputted form the bus are inverted when the number of bits of the first value in the data to be written is a half or more of the predetermined bit length, and without inverting the values of the respective bits in other cased, and at the time of reading the data, in the case where the number of the first value in the data is judged to be a half or more of the predetermined bit length when the data to be read out is written in the memory unit, the values of the respective bits of the data read from the designated memory cells of the memory unit are inverted and read out, and in the other case, the data is read out without being inverted.

In the method of writing/reading data of read only memory capable of writing data of the invention, the second value is written when the number of bits of the first value in the data to be written in the memory unit is judged to be a half or more of a predetermined bit length, and the first value is written when the number of bits of the first value in the data to be written in the memory unit is judged to be less than a half of the predetermined bit length, into the respective judge result memory cells corresponding to the respective data of the judge result memory unit comprising plural judge result memory cells into which the first value is written when electric current flows and the second value is written when electric current does not flow, corresponding to the respective data.

Moreover, according to such a method of writing/reading data of a read only memory capable of writing data of the invention, the second value is written when the number of bits of the first value in data to be written in the memory unit is judged to be a half or more of a predetermined bit length, and the first value is written when the number of bits of the first value in data to be written in the memory unit is judged to be less than a half, into the respective judge result memory cells corresponding to the respective data of the judge result memory unit comprising plural judge result memory cells into which the first value is written when electric current flows and the second value is written when electric current does not flow, corresponding to the respective data.

The above and further objects and features of the invention will more fully be apparent from the following detailed description with accompanying drawings.

DESCRIPTION OF THE PREFERRED EMBODIMENTS

Figure 1:
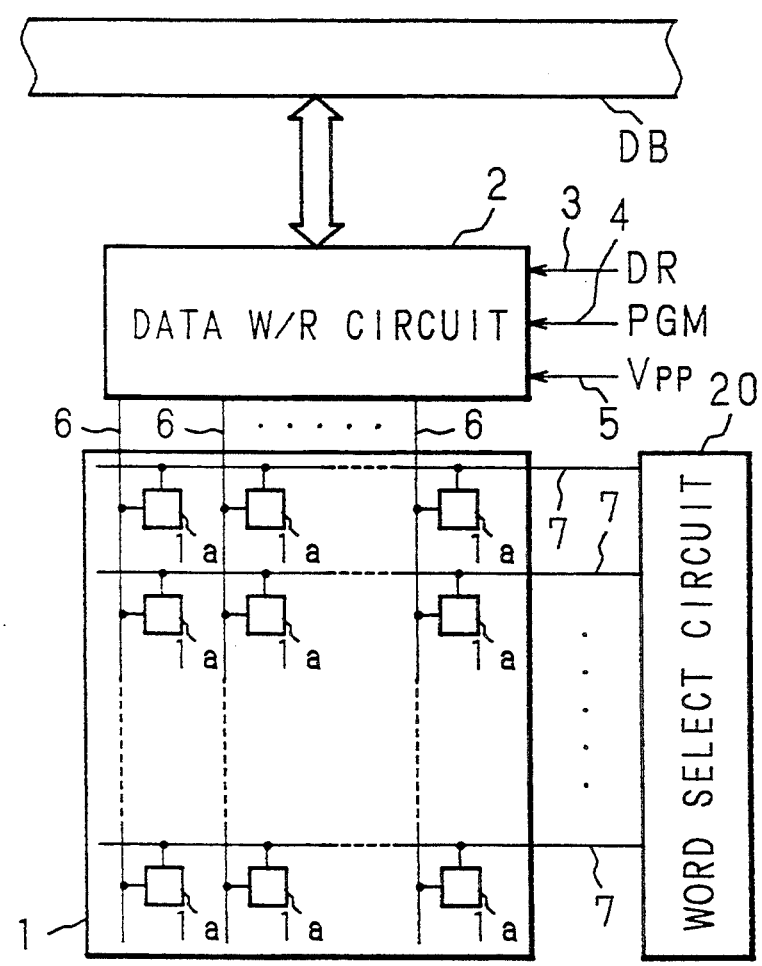
FIG. 1 is a block diagram showing a configuration of a PROM as a conventional read only memory capable of writing data built in a general microcomputer.

In the following, description will be made on the present invention, referring to the drawings showing the embodiments thereof.

Figure 2:
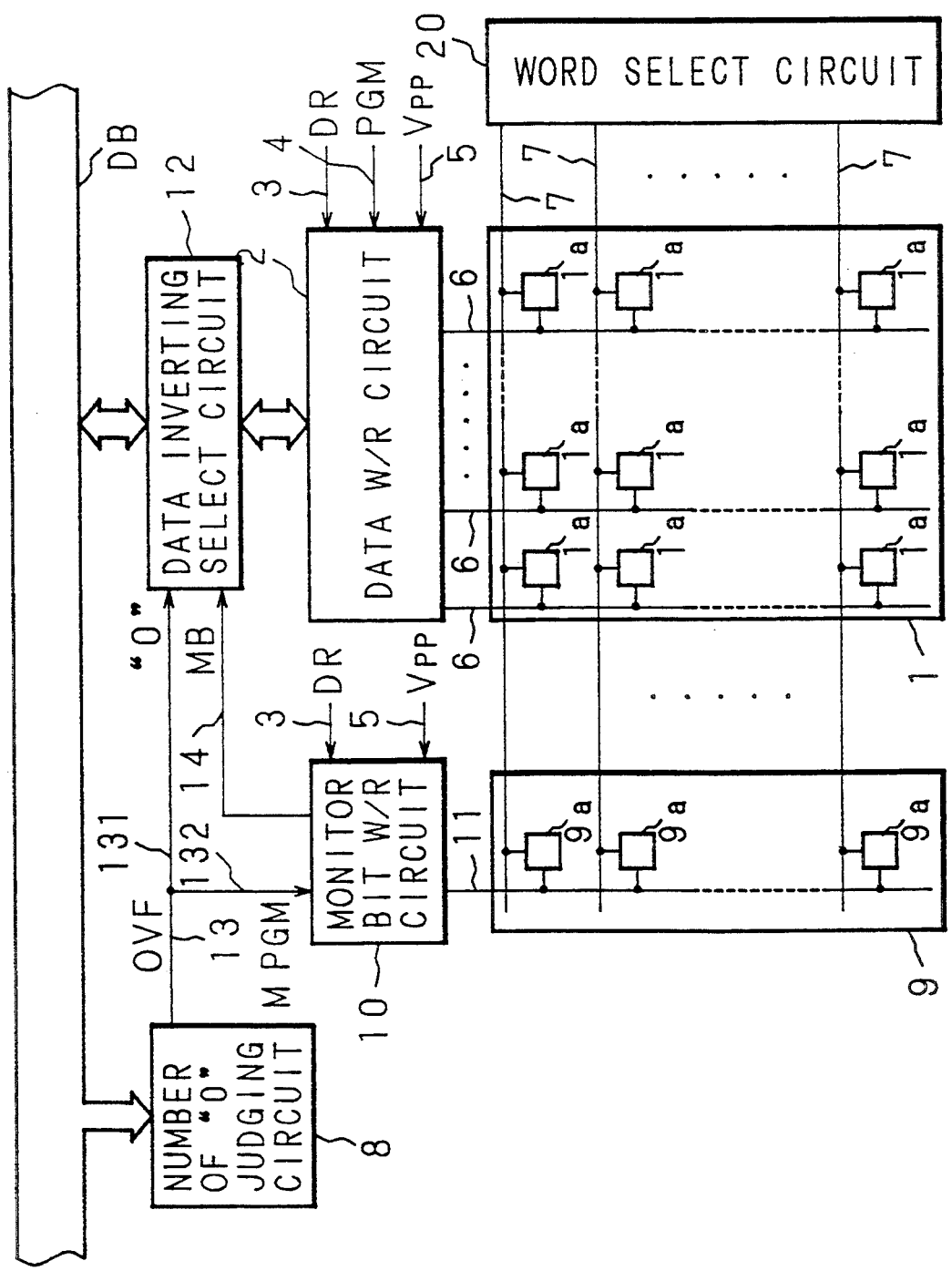
FIG. 2 is a block diagram showing a configuration of one embodiment of a read only memory capable of writing data related to the invention.

FIG. 2 is a block diagram showing a configuration of one embodiment of a read only memory capable of writing data related to the invention.

In FIG. 2, reference numeral 1 designates memory cell array in which plural memory cells 1a are arranged in a state of matrix in row×column direction.

The memory cell array 1 is connected to a data bus DB through a data inverting select circuit 12 and a data writing/reading (W/R) circuit 2 to be described later. In the respective memory cells 1a, the values of the respective bits of data inputted from the data bus DB by the data writing/reading circuit 2 are written, while the values stored in the respective memory cells 1a are read to the data bus DB as the values of the respective bits.

The respective memory cells 1a in the memory cell array 1 are arranged, as aforementioned, in a state of matrix, the memory cells 1a in the respective rows (columns) being connected to a common word lines 7 in the respective rows (columns) direction, and the respective memory cells 1a in the respective columns (rows) direction being connected to a common bit lines 6. Accordingly, each memory cell 1a is connected to any one word line 7 and any one bit line 6.

Each word line is connected to a word select circuit 20, and each bit line 6 is to the data writing/reading circuit 2.

To the data writing/reading circuit 2, a data read signal (hereinafter, to be called a DR signal) line 3, a data writing pulse signal (hereinafter, to be called a PGM signal) line 4 and a power source line 5 are connected.

The power source line 5 supplies a data writing voltage $V_{pp}$ to the data writing/reading circuit 2. When the DR signal given to the data writing/reading circuit 2 by the DR signal line 3 becomes active, data is read to the data writing/reading circuit 2 from the memory cell array 1. When the PGM signal given to the memory cell array 1 becomes low ("L") level by the PGM signal line 4, the power source line 5 is selectively connected to the bit line 6 in which data "0" is to be written, and the data writing voltage $V_{pp}$ is outputted.

Numeral 8 designates a number of "0" judging circuit as a judging means. The number of "0" judging circuit 8 is connected to the data bus DB, and the data to be written in the memory cell array 1 from the data bus DB is also to be given to the number of "0" judging circuit 8. When the data to be written in the memory cell array 1 is given from the data bus DB, the number of "0" judging circuit 8 judges whether or not the number of bits of the data "0" among them is a half or more of the data length.

To be concrete, when the number of memory cells 1a connected to the respective word lines 7 of the memory cell array 1 is 16, in other words, when the data length to be written in the memory cell array 1 in one data writing operation is 16 bits, in the case where 8 bits or more among the data are "0" the number of "0" judging circuit 8 outputs an over flow signal OVF of high ("H") level to an over flow signal line 13, to be described later. The overflow signal OVF is given to the aforesaid data inverting select circuit 12 through a "0" signal line 131 as a number of "0" judge result signal (hereinafter, to be called a "0" signal), and at the same time, given to a monitor bit writing/reading circuit being judge result data writing/reading means through a monitor data writing pulse signal (hereinafter, to be called a MPGM signal) line 132 as a MPGM signal.

Reference numeral 9 designates a monitor bit cell group being judge result storing means, and numeral 10 designates the aforementioned monitor bit writing/reading circuit.

The monitor bit cell group 9 comprises the monitor bit cells 9a as the judge result memory cells by the same number as the word lines 7, and to the monitor bit cells 9a, the respective word lines 7 are connected through the memory cell array 1. And to each of the monitor bit cell 9a of the monitor bit cell group 9, a monitor bit line 11 is connected from the monitor bit writing/reading circuit 10.

Accordingly, when any one of the word lines 7 is selected by the word select circuit 20, not only the respective memory cells 1a connected to the word line 7, but also the monitor bit cell 9a connected thereto is accessed.

To the monitor bit writing/reading circuit 10, in the same way as the data writing/reading circuit 2, since the DR signal line 3 and the power source line 5 are connected and the MPGM signal is also given through the MPGM signal line 132, the basic operation of the circuit 10 is also same as that of the data writing/reading circuit 2 except that there is only one monitor bit line 11 corresponding to the bit line 6 of the data writing/reading circuit 2.

However, to the monitor bit writing/reading circuit 10, the overflow signal OVF is given as the MPGM signal through the overflow signal line 13 and the MPGM signal line 132. Therefore, the monitor bit writing/reading circuit 10 writes data "1" when the MPGM signal is "H" level, and data "0" when "L" level.

To be concrete, when the MPGM signal is "L" level, by outputting the data writing voltage $V_{pp}$ being supplied from the power source line 5 to the monitor bit line 11, the monitor bit writing/reading circuit 10 writes data "0" in the monitor bit cell 9a connected to the word line 7 selected by the word select circuit 20. On the other hand, when the MPGM signal is "H" level, by not outputting the data writing voltage $V_{pp}$ supplied from the power source line 5 to the monitor bit line 11, the monitor bit writing/reading circuit 10 writes data "1" to the monitor bit cell 9a connected to the word line 7 selected by the word select circuit 20.

Meanwhile, at the time of reading data from the memory cell array 1, in the same way as the data writing/reading circuit 2, the monitor bit writing/reading circuit 10, by being given the DR signal through the DR signal line 3, reads data stored in the monitor bit cell 9a connected to the selected word line 7 and outputs it to the monitor bit signal line 14 as a monitor bit signal (hereinafter, to be called an MB signal) to be given to the data inverting select circuit 12.

Figure 3:
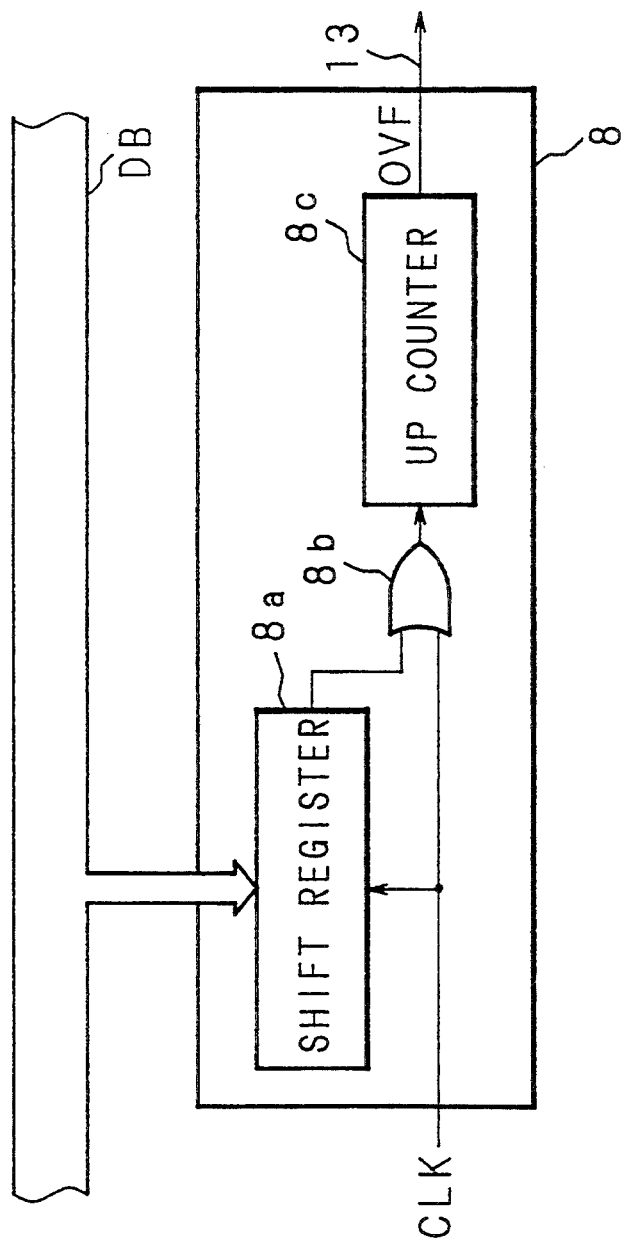
FIG. 3 is a block diagram showing a configuration example of a number of "0" judging circuit of a read only memory capable of writing data related to the invention.

FIG. 3 is a block diagram showing a configuration example of the number of "0" judging circuit 8.

In FIG. 3, reference character 8a designates a shift register, 8b a two-input OR gate, and 8c an up counter.

To the shift register 8a, the data bus DB is connected, and data to be stored in the memory cell array 1 is inputted. Clock CLK is given to the shift register 8a, and the register 8a shifts data inputted from the data bus DB bit by bit in synchronism with the clock CLK from the left side to the right side in FIG. 3 and outputs the extreme right side bit so as to input it to one input terminal of an OR gate 8b.

To the other input terminal of the OR gate 8b, clock CLK is inputted. Therefore when the data outputted from the shift register 8a is "0", the clock CLK is outputted intact as the output of the OR gate 8b, and when the data outputted from the sift register 8a is "1", the output of the OR gate 8b is fixed at "H" level.

The up counter 8c is so constructed that it inputs the output of the aforementioned OR gate 8b to count a rising edge of the clock CLK. Accordingly, the up outer 8c is to count the number of bits of "0" in the data held in the shift register 8a. And when the up counter 8c counts a half number (8 bits when the data length is 16 bits) of data length stored in the memory cell array 1, it overflows to output the overflow signal OVF of "H" level. The overflow signal OVF is outputted to the overflow signal line 13, and it is given to the data inverting select circuit 12 from the "0" signal line 131 as the "0" signal, and given to the monitor bit writing/reading circuit 10 from the MPGM signal line 132 as the MPGM signal.

Explanation will be made on the operation of the PROM of the invention so constructed as in the above will be made in the following.

The operation at the time of writing data is as follows.

At first, one row (column) of data to be stored in the memory cell array 1 is given to the data inverting select circuit 12 and number of "0" judging circuit 8. At this time, an address signal, which indicates the address of the memory cell array 12 in which the data is to be stored, is given to the decoder (not shown) from the outside.

At the number of "0" judging circuit 8, number of bits of "0" in the data given from the data bus DB is judged whether it is a half or more of the data length or not in such a manner as aforementioned.

When the data length is assumed to be 16 bits and the number of bits of "0" is 8 or more, for example, the overflow signal OVF of "H" level is outputted to the overflow signal line 13 from the number of "0" judging circuit 8, outputted to the data inverting select circuit 12 from the "0" signal line 131 as the "0" signal, and to the monitor bit writing/reading circuit 10 from the MPGM signal line 132 as the MPGM signal.

At the data inverting select circuit 12, when the "0" signal given from the "0" signal line 131 is "H" level, the values of the respective bits of the data inputted from the data bus DB are inverted. For example, when the data inputted form the data bus DB is "00h (h designates hexadecimal number)", it is made "FFh". The data inverting select circuit 12 sends the data obtained by inverting the values of the respective bits in such a way to the data writing/reading circuit 2.

On the other hand, the word select circuit 20 selects one word line 7 responsive to a decode result of an address given from the outside, thereby the respective memory cells 1a of one row (column) of the memory cell array 1 connected to the word line 7 are selected.

Next, when the PGM signal given to the data writing/reading circuit 2 by the PGM signal line 4 becomes "L" level, in the same way as in the conventional example, the data writing/reading circuit 2 fixes, as aforementioned, the potential of the bit line 6 connected to a memory cell 1a in which "0" is written in data sent from the data inverting select circuit 12 at the data writing voltage $V_{pp}$ given from the power source line 5. While the PGM signal keeps "L" level, data is written by making electric current flow between the source and drain of each memory cell 1a through the bit line 6.

In addition, it is needless to say that the data to be written in the memory cell array 1 by the data writing/reading circuit 2 in such a way as abovementioned is the data obtained by inverting the values of the respective bits of the original data by the data inverting select circuit 12.

At the same time of the writing data in the aforementioned memory cell array 1, a monitor cell 9a of the monitor bit cell group 9 connected to the word line 7 selected by the word select circuit 20 is accessed, and the MPGM signal given to the monitor bit writing/reading circuit 10 from the MPGM signal line 132 becomes "H" level as well. Accordingly, to the monitor bit cell 9a connected to the selected word line 7, "1" is written.

Next, a case where the number of bits of "0" is less than 8 will be explained, when the data length to be stored in the memory cell array 1 is assumed, for example, to be 16 bits.

In this case, the overflow signal OVF of "L" level is outputted to the overflow signal line 13 from the number of "0" judging circuit 8, and given to the data inverting select circuit 12 from the "0" signal line 131 as the "0" signal, and given to the monitor bit writing/reading circuit 10 from the MPGM signal line 132 as the MPGM signal, respectively.

At the data inverting select circuit 12, when the "0" signal given from the "0" signal line 131 is "H" level, it sends the data inputted from the data bus DB to the data writing/reading circuit 2 without inverting the values of the respective bits.

Since the operation that the data sent to the data writing/reading circuit 2 from the data inverting select circuit 12 is written, in the memory cell array 1 is same as in the aforementioned case, the explanation thereof will be omitted.

Meanwhile, at the same time of the writing of data in the aforementioned memory cell array 1, a monitor bit cell 9a of the monitor bit cell group 9 connected to the word line 7 selected by the word select circuit 20 is accessed, and the MPGM signal given to the monitor bit writing/reading circuit 10 from the MPGM signal line 132 becomes "L" level. Accordingly, to the monitor bit cell 9a connected to the selected word line, "0" is written.

On the other hand, the operation at the time of reading data is as follows.

At first, an address signal, which indicates the address of the memory cell 1a in which the data to be read from the memory cell array 1 is given to a decoder (not shown) from the outside.

The word select circuit 20 selects one word line 7 responsive to the decode result given from the outside, thereby the respective memory cells 1a of one row (column) of the memory cell array 1 connected to the selected word line 7 are accessed.

Next, when the DR signal given from the DR signal line 3 becomes active, the data writing/reading circuit 2 reads a signal (data) stored in the respective memory cells 1a of the row (column) connected to the word line 7 selected by the word select circuit 20 and outputs it to the data inverting select circuit 12.

On the other hand, the monitor bit cell 9a of the monitor bit group 9 connected to the word line 7 selected by the word select circuit 20 is also accessed. At the same time, since the DR signal given to the monitor bit writing/reading circuit 10 through the DR signal line 3 also becomes active, the value stored in the monitor bit cell 9a of the monitor bit cell group 9 connected to the word line 7 selected by the word select circuit 20 is read by the monitor bit writing/reading circuit 10.

In such a way, when the value read to the monitor writing/reading circuit 10 is "0", it means that the data read into the data writing/reading circuit 2 from the memory cell array 1 was not inverted at the time of being stored in the memory cell array 1. In this case, the data read to the data writing/reading circuit 2 from the memory cell array 1 is outputted intact to the data bus DB without being inverted at the data inverting select circuit 12.

But, when the value read to the monitor bit writing/reading circuit 10 is "1", it means that the data read into the data writing/reading circuit 2 from the memory cell array 1 was inverted at the time of being stored in the memory cell array 1. In this case, the data read into the data writing/reading circuit 2 is outputted to the data bus DB after being inverted by the data inverting select circuit 12.

As in the abovementioned embodiment, according to the read only memory capable of writing data and the data and the method of writing/reading data of the invention, the maximum value of the electric current $I_{pp}$ required for the case where electric current is made to flow to a memory cell at the time of writing "0" of a binary number in the memory cell of a PROM is same as in the case where the number of a half bits of the data length of the data to be written in the memory cell array is "038 .

To be concrete, when the data length is 16 bits and 8 bits among them are "0", eight bits of "0" are written into the memory cell array of the PROM after the data is inverted, but "1" is written into the monitor bit cell group, therefore eight bits of "0" are written as a whole. When the data length is, for example, 16 bits, and 7 bits among them are "0", seven bits of "0" are written into the memory cell array of the PROM, the data not being inverted at the time. However, since "0" is written into the monitor bit cell group, eight bits of "0"s are written as a whole. Further, when the data length is, for example, 16 bits, and 9 bits among them are "0", the data is inverted and seven bits of "0" are written into the memory cell array of the PROM. But since "1" is written into the monitor bit cell group, seven bits of "0"s are written as a whole.

Accordingly, when the data length remains as it is, the electric current consumed at the time of writing data into the PROM is reduced, and also the aluminum width of the power source line supplying the data writing voltage can be reduced. And when the data length is enlarged, the electric current consumed at the writing of the data to the PROM can be suppressed to almost the same degree after enlarging the data, and it becomes unnecessary to enlarge the aluminum width of the power source line supplying the data writing voltage.

In addition, when the data length is an odd number, for example, when the data length is 17 bits and 9 bits among them are "0", the data is inverted and eight bits of "0" are written into the memory cell array of the PROM, but "1" is written into the monitor bit cell group, therefore, eight bits of "0" are written as a whole. And, in the same way, for example, when the data length is 17 bits and 8 bits among them are "0", the data is not inverted and eight bits of "0" are written into the memory cell array of the PROM. But since "0" is written into the monitor bit cell group, nine bits of "0" are written as a whole.

Accordingly, when the data length is an odd number, "0" of a half number of bits of the value obtained by adding 1 to the data length as a maximum value is to be written as a whole, and the above effect is almost same as the case where the aforementioned data length is an even number.

In addition, in the abovementioned embodiment, electric current is made to flow into the memory cell in which "0" of a binary number is written, however, it is needless to say that the present invention can be applied to such a PROM that electric current is made to flow into the memory cell in which "1" is written, and in that case, it is sufficient to invert the data and judge whether to write it into the memory cell array corresponding to the fact that whether the number of memory cells into which "1" is written is a half or more of the data length or not.

As abovementioned, according to the read only memory capable of writing data and the method of writing/reading data of the invention, at the time of writing, for example, "0" of a binary number to a memory cell of a PROM, when it is necessary to make electric current flow into the memory cell, the maximum value of the data writing current $I_{pp}$ is same as in the case where a half number of bits of the length of the data to be written in the memory cell array in the conventional PROM are "0".

Accordingly, when the present invention is applied, electric current consumed at the time of writing of the data to the memory cell array is reduced when the data length remains as it is, and also the aluminum width of the power source line supplying the data writing voltage can be reduced. And when the data length is enlarged, it is possible to suppress the electric current consumed at the writing of the data into the memory cell array to almost the same degree after the data is enlarged, and it is unnecessary to enlarge the aluminum width of the power source line supplying the data writing voltage.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A read only memory capable of writing data, comprising:

a memory unit comprising plural memory cells into which a first value is written when electric current flows into at least one of the plural memory cells and a second value is written when electric current does not flow into at least another of the plural memory cells; and data writing/reading means, which connected to a data bus (DB), for writing values of respective bits of data of a predetermined bit length whose respective bits inputted from said data bus (DB) are indicated in binary either by the first value or the second value into the designated memory cells in said memory unit respectively, and for reading the values of the respective bits of said predetermined bit length from the designated memory cells in said memory unit and outputting them to said data bus (DB);

characterized by comprising:

judging means for judging whether the number of bits of the first value in data to be written into said memory unit is a half or more of said predetermined bit length or not and producing a judge result;

judge result storing means for converting the judge result received from said judging means into judge data and for storing the judge data; and data inverting means for, when said judging means judges that the number of bits of the first value in data to be written in said memory unit is a half or more of said predetermined bit length, inverting the values of the respective bits of said data and outputting them to said data writing/reading means, and for, when said judging means stores that the number of bits of the first value in the data read from said memory unit is a half or more of said predetermined bit length, inverting the values of the respective bits of said data read from said memory unit by said data writing/reading means and outputting them into said data bus (DB).

2. A read only memory capable of writing data as set forth in claim 1, wherein, said judge result storing means comprises:

a judge result memory unit comprising plural judge result memory cells in which the first value is written when electric current flows into at least one of the plural result memory cells and the second value is written when the electric current does not flow into at least another of the plural result memory cells; and judge result data writing/reading means for writing the second value when said judging means judges that the number of bits of the first value in the data to be written into said memory unit is a half or more of said predetermined bit length, and writing the first value when said judging means judges that the number of bits of the first value in the data to be written into said memory unit is less than a half of said predetermined bit length, into the judge result memory cells corresponding to the respective data respectively, and for reading the values stored in said judge result memory cells corresponding to the data to be read from said memory unit and outputting them to said data writing/reading means.

3. A read only memory capable of writing data as set forth in claim 1, wherein said first value is "0" of binary data, and said second value is "1" of binary data.

4. A read only memory capable of writing data as set forth in claim 1, wherein said first value is "1" of binary data, and said second value is "0" of binary data.

5. A method of writing/reading data for a read only memory capable of writing data, in which the values of the respective bits of data of a predetermined bit length, each bit being binary-notated either by a first value or a second value are written, and the values of the respective bits of the data of said predetermined bit length from the designated memory cells of said memory unit are read, comprising steps for;

judging whether the number of bits of the first value in data to be written in said memory unit is a half or more of said predetermined bit length;

writing the values of the respective bits of the data to be written into said memory unit after inverting them when the number of bits of the first value in said data is a half or more of said predetermined bit length, and without inverting them in other cases, into the designated memory cells of said memory unit respectively; and reading the values of the respective bits of the data read from the respective designated memory cells of said memory unit after inverting them when the number of bits of the first value among them is judged to be a half or more of said predetermined bit length at the time of writing said data to be read from said memory unit, and reading them without inverting them in other cases.

6. A method of writing/reading data of read only memory capable of writing data as set forth in claim 5, wherein the second value is written when the number of bits of the first value in data to be written into the memory unit is judged to be a half or more of the predetermined bit length, and the first value is written when the number of bits of the first value in data to be written, in the memory unit is less than a half of the predetermined bit length, corresponding to the respective data into the respective judge result memory cells which corresponds to the respective data of a judge result memory unit comprising plural judge result memory cells into which the first value is written when electric current flows into a least one of the plural judge result memory cells and the second value is written when electric current does not flow into at least another of the plural judge result memory cells.

7. A method of writing/reading data of read only memory capable of writing data as set forth in claim 5, wherein, said first value is "0" of binary data, and said second value is "1" of binary data.

8. A method of writing/reading data of read only memory capable of writing data as set forth in claim 5, wherein, said first value is "1" of binary data, and said second value is "0" of binary data.

9. A read only memory having a memory unit with memory cells, comprising:
- means for determining whether a first number of bits of a first value to be written to the memory unit is greater than or equal to a predetermined bit length;
- means for writing first bits of the bits to be written to the memory unit in first memory cells after inverting the first bits when the first number of bits of the first value is a half or more of the predetermined bit length, and for writing second bits of the bits to be written to the memory unit in second memory cells without inverting the second bits when the first number of bits of the first value is less than the predetermined bit length; and
- means for selectively reading the first and second bits from the first and second memory cells of the memory unit.

10. A method of reading and writing data for a memory having a memory unit with memory cells, comprising the steps of:
- determining whether a first number of bits of a first value to be written to the memory unit is greater than or equal to a predetermined bit length;
- writing first bits of the bits to be written to the memory unit in first memory cells after inverting the first bits when the first number of bits of the first value is a half or more of the predetermined bit length;
- writing second bits of the bits to be written to the memory unit in second memory cells without inverting the second bits when the first number of bits of the first value is less than the predetermined bit length; and
- selectively reading the first and second bits from the first and second memory cells of the memory unit.

* * * * *